(12) United States Patent
Serrano et al.

(10) Patent No.: US 7,288,985 B2
(45) Date of Patent: Oct. 30, 2007

(54) CURRENT MIRROR WITH PROGRAMMABLE FLOATING GATE

(75) Inventors: Guillermo José Serrano, Atlanta, GA (US); Paul Edward Hasler, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 75 days.

(21) Appl. No.: 11/326,833

(22) Filed: Jan. 5, 2006

(65) Prior Publication Data
US 2006/0120163 A1    Jun. 8, 2006

Related U.S. Application Data

(63) Continuation of application No. 10/446,087, filed on May 27, 2003, now Pat. No. 7,034,603.

(51) Int. Cl.
*G05F 1/10* (2006.01)
(52) U.S. Cl. ..................................... 327/543
(58) Field of Classification Search ............... 327/530, 327/534, 535, 537, 538, 540, 541, 543
See application file for complete search history.

(56) References Cited

U.S. PATENT DOCUMENTS

| | | | |
|---|---|---|---|
| 5,748,534 A * | 5/1998 | Dunlap et al. | 365/185.21 |
| 5,990,816 A | 11/1999 | Kramer et al. | |
| 6,014,044 A | 1/2000 | Kramer et al. | 327/81 |
| 6,175,521 B1 | 1/2001 | Pascucci et al. | 365/185.18 |
| 6,195,289 B1 | 2/2001 | Pasotti et al. | |
| 6,366,519 B1 | 4/2002 | Hung et al. | 365/226 |
| 7,038,544 B2 * | 5/2006 | Diorio et al. | 330/279 |
| 7,048,195 B2 * | 5/2006 | Berstis | 235/492 |

OTHER PUBLICATIONS

Guillermo Serrano, Matt Kucic, Paul Hasler, "Investigating Programmable Floating-Gate Digital-to-Analog Converter as Single Element or Element Arrays," pp. 1-3; submitted for publication following 45th Midwest Symposium on Circuits and Systems, IEEE Conference Proceeding, Aug. 4-7, 2002.
Angelo Pereira, Philomena Brady, Abishek Bandyopadhyay, Paul Hasler, "Experimental Investigations of Floating-Gate Circuits for Delta-Sigma Modulators," pp. I208-I210; submitted for publication following 45th Midwest Symposium on Circuits and Systems, IEEE Conference Proceeding, Aug. 4-7, 2002.

(Continued)

*Primary Examiner*—Jeffrey Zweizig
(74) *Attorney, Agent, or Firm*—Thomas, Kayden, Horstemeyer & Risley LLP

(57) ABSTRACT

Systems and methods are discussed for using a floating-gate MOSFET as a programmable reference circuit. One example of the programmable reference circuit is a programmable voltage reference source, while a second example of a programmable reference circuit is a programmable reference current source. The programmable voltage reference source and/or the reference current source may be incorporated into several types of circuits, such as comparator circuits, current-mirror circuits, and converter circuits. Comparator circuits and current-mirror circuits are often incorporated into circuits such as converter circuits. Converter circuits include analog-to-digital converters and digital-to-analog converters.

12 Claims, 9 Drawing Sheets

OTHER PUBLICATIONS

Philomena Brady, Paul Hasler, "Investigations Using Floating-Gate Circuits for Flash ADCS," pp. II-83-II-86; submitted for publication following 45th Midwest Symposium on Circuits and Systems, IEEE Conference Proceeding, Aug. 4-7, 2002.

Farhan Adil, Paul Hasler, "Offset Removal from Floating Gate Differential Amplifiers and Mixers," Georgia Institute of Technology Department of Electrical and Computer Engineering, pp. I-251-I-254, submitted for publication during or after Midwest Symposium on Circuits and Systems, IEEE Conference Proceeding Aug. 4-7, 2002.

Farhan Adil, Guillermo Serrano, Paul Hasler, "Offset Removal Using Floating-Gate Circuits for Mixed-Signal Systems," Georgia Institute of Technology Department of Electrical and Computer Engineering, pp. 190-195, submitted for publication during or after Southwest Symposium on Circuits and Systems, IEEE Conference Proceeding Feb. 23-25, 2003.

Patent Application entitled, "Digital-To-Analog Converter with Programmable Floating Gate," U.S. Appl. No. 11/326,834, filed Jan. 5, 2006.

Patent Application entitled, "Analog-To-Digital Converter with Programmable Floating Gate," U.S. Appl. No. 11/326,832, filed Jan. 5, 2006.

* cited by examiner

CURRENT MIRROR WITH PROGRAMMABLE FLOATING GATE

CROSS-REFERENCE TO RELATED APPLICATIONS

This application is a continuation of U.S. patent application Ser. No. 10/446,087 entitled "FLOATiNG-GATE REFERENCE CIRCUIT" filed on May 27, 2003, now U.S. Pat. No. 7,034,603 which is hereby incorporated by reference in its entirety. This application is related to co-pending commonly assigned Non-Provisional Application entitled, "DIGITAL-TO-ANALOG CONVERTER WITH PROGRAMMABLE FLOATING GATE," filed concurrently herewith on Jan. 5, 2006, and accorded Ser. No. 11/326,834 and to co-pending commonly assigned Non-Provisional Application entitled, "ANALOG-TO-DIGITAL CONVERTER WITH PROGRAMMABLE FLOATING GATE," filed concurrently herewith on Jan. 5, 2006, and accorded Ser. No. 11/326,832.

STATEMENT REGARDING FEDERALLY SPONSORED RESEARCH OR DEVELOPMENT

The U.S. government may have a paid-up license in this invention and the right in limited circumstances to require the patent owner to license others on reasonable terms as provided for by the terms of Grant No. EIA-0083172 awarded by the National Science Foundation of the United States.

TECHNICAL FIELD

The present disclosure generally relates to the field of current mirror circuits. More specifically, the disclosure relates to a current mirror with programmable floating gate.

BACKGROUND OF THE INVENTION

Two classes of reference circuits that are used in electronic circuits may be generally referred to as "reference voltage nodes" and "reference current sources." A fixed-value reference voltage node can be created by using fixed-value discrete resistors configured in a resistive divider circuit. The accuracy of the reference voltage created by such a resistive divider circuit is determined by the accuracy of the fixed-value resistors and the accuracy of the voltage source(s) connected to the resistors. The accuracy of a fixed-value resistor is typically defined by a tolerance parameter that specifies the allowable variation of resistance from a nominal resistance value. For example, a 100 ohm, 10% resistor may be used in a circuit that permits a variation in resistance between 90 and 110 ohms, while a 100 ohm, 1% resistor may be used in a circuit that only permits a variation in resistance between 99 and 101 ohms.

The tolerance parameter of a resistor is controlled by several factors, one of which relates to a trimming procedure performed during manufacture of the resistor. The trimming procedure is used to remove excess resistive material from a resistor so as to produce a nominally accurate resistance value. Such a trimming procedure is applicable not only to discrete resistors but also to planar resistors such as those that are employed on a printed circuit board (PCB) or embedded inside integrated circuit (IC) packages. For example, the resistors of a reference voltage node wherein the node is a part of a larger circuit inside an IC, may be trimmed to obtain a desired reference voltage. Such trimming when carried out over a large number of ICs can become an expensive process, potentially resulting in the creation of an undesirable trade-off between circuit performance and cost.

In contrast to a fixed-value reference voltage node, a variable-value reference voltage node can be created by using a variable resistor that is also referred to as a potentiometer. A variable resistor permits a circuit-user the flexibility to vary the value of the variable resistor, thereby allowing programming of a reference voltage value based on specific requirements. Such requirements may be of a variable nature depending upon the needs of a multiplicity of customers or upon the multiplicity of needs of one customer, at any time subsequent to manufacture of the variable resistor. While user-controlled programming of a reference voltage node by the use of a potentiometer, provides an advantage in terms of flexibility-of-use, one shortcoming in doing so, relates to the possibility of accidental misadjustment of the potentiometer thereby leading to potential circuit malfunction.

Electronically-controlled potentiometers have been implemented inside ICs to a limited extent. But the use of such electronically-controlled potentiometers in conjunction with additional circuitry inside the same IC is relatively uncommon and may not be typically carried out in a cost-effective manner. For example, it is fairly untypical to provide an electronic potentiometer as a part of a variable-value reference voltage node, such a voltage node being in turn used in conjunction with a comparator circuit inside the same IC. As is known in the art, comparator circuits are used in many applications, including converter circuits such as analog-to-digital converters.

In addition to a reference voltage node, the second class of reference circuit used in various applications such as comparators and converters, is often referred to as a reference current source. A reference current source is typically created from a transistor circuit that incorporates one or more voltages and one or more resistors. The resistor values are selected either by selecting suitable fixed-value discrete resistors or by selecting suitable potentiometers, to generate appropriate currents in the transistor circuit. One example of a circuit used as a reference current source is known in the art as a current mirror circuit. The shortcomings related to resistors, described earlier with reference to voltage sources is also largely applicable to reference current sources.

Applications that use reference voltage nodes and reference current sources will be described in more detail using prior art figures. One such prior art figure, FIG. 1 illustrates an analog-to-digital converter (ADC). While such an ADC can be constructed using discrete devices, such as multiple voltage comparators and resistors that are placed upon a PCB, an ADC is often constructed using devices fabricated upon a substrate inside an IC. The IC packaging provides numerous benefits, yet suffers from the resistor-related handicaps outlined earlier. For example, the accuracy of each of reference voltage values $V_{ref}(n)$ through $V_{ref}(0)$ used in the ADC circuit, is dependent upon the accuracy of each of the resistors, thereby requiring a comparatively expensive trimming process during manufacture. Additionally, once the IC has been manufactured, the reference voltage values cannot be changed because the resistors cannot be readily modified to create other resistance values.

One example of a reason for desiring a change in reference voltage values may arise out of a change in user requirement that necessitates conversion of a linear ADC to a non-linear ADC. In one example of a prior-art linear ADC, each of the resistor values is selected to be identical, thereby creating a multiplicity of reference voltages such that the voltage difference between any one voltage reference node and its neighboring voltage reference node remains identical throughout the resistive divider chain. For example, if the difference between $V_{ref}(n)$ and $V_{ref}(n-1)$ is 0.5V, the difference between $V_{ref}(n-1)$ and $V_{ref}(n-2)$ will also be 0.5V.

On the other hand, in a non-linear ADC, each of the resistor values will be scaled suitably to produce a multiplicity of reference voltages such that the voltage difference between any one voltage reference node and its neighboring voltage reference node is different from a second voltage reference node and its neighboring voltage reference node. For example, if the difference between $V_{ref}(n)$ and $V_{ref}(n-1)$ is 0.5V, the difference between $V_{ref}(n-1)$ and $V_{ref}(n-2)$ may be set at 1.5V—a scaling factor of 3. Such a non-linear ADC will consequently require setting the values of the resistors to non-identical values.

FIG. 2 illustrates one exemplary embodiment of a prior art digital-to-analog converter (DAC) 200, which accepts a multi-bit digital input signal and produces an analog output voltage that reflects the state of the digital input signal. DAC 200 incorporates n binarily weighted current sources $I_0$, $I_0/2$, $I_0/2^1$, $I_0/2^2$, ... $I_0/2^{n-1}$ that are switched to the output by n current switches located in current switcher 205. The most significant bit (MSB) of the digital input signal determines the state of the switch that switches the $I_0$ current, while the least significant bit (LSB) of the digital input signal determines the state of the switch that switches the $I_0/2^{n-1}$ current. When used as a current-multiplying DAC, it is common for a precision current mirror circuit 215 to generate reference current $I_{ref}$, which is directly related to the output precision current $MI_0$. The analog output current $MI_0$ is usually converted into the analog output voltage by an amplifier 220.

Current mirror 215 uses two transistors 216 and 217 that are connected to each other such that current $I_{ref}$ through transistor 216 is "mirrored" by current $I_{ref}$ through transistor 217. While FIG. 2 does not show resistors incorporated into the current mirror circuit 215, most practical applications utilize collector and/or emitter resistors that influence the value of the $I_{ref}$ current. The use of these resistors lead to the limitations described earlier, including limitations such as trimming costs and lack of user-programmability.

FIG. 3 show further details of current switcher 205 and the weighted current generator 210 of FIG. 2. Transistors 312 and 314 constitute one of several differential comparators inside current switcher 205. The LSB of the digital input signal controls the switching of a fractional value of the overall current ($MI_0$) through transistor 312. The fractional value, which equals ($I_0/2^{n-1}$), is determined by the value of emitter resistor 316 inside the weighted current generator 210.

Transistors 322 and 318 constitute a second one of the several differential comparators inside current switcher 205. The MSB of the digital input signal controls the switching of a fractional value of the overall current ($MI_0$) through transistor 318. The fractional value, which equals ($I_0$), is determined by the value of emitter resistor 324 inside the weighted current generator 210. The sum total of currents that is produced at any instance by the various transistors that have been switched on by the corresponding bits of the digital input signal, constitutes the overall current ($MI_0$) for any particular digital input signal.

Resistors 316 and 324 are part of a binarily weighted set of resistors, some of which are created by a multiplicity of resistors connected in parallel. The shortcomings of fixed as well as variable resistors that were described earlier, is applicable to this circuit also.

FIG. 4 illustrates a second exemplary embodiment of a prior art digital-to-analog converter (DAC) 400, which accepts a multi-bit digital input signal and produces an analog output voltage that reflects the state of the digital input signal. DAC 400 uses n binarily weighted current sources $I_0$, $I_0/2$, $I_0/2^1$, $I_0/2^2$, ... $I_0/2^{n-1}$ that are switched to the output by n transistors 405, 410, ... 415. The most significant bit (MSB) of the digital input signal determines the state of transistor 405 that switches the $I_0$ current, while the least significant bit (LSB) of the digital input signal determines the state of transistor 415 that switches the $I^0/2^{n-1}$ current. The analog output current $MI_0$, which is the sum of the currents through transistors 405, 410, ... and 415 for any particular digital input signal, is usually converted into the analog output voltage by an amplifier 420. Analog output current $MI_0$ is scaled to be proportional to $I_{ref}$ the reference current that is generated by a current mirror circuit (not shown).

Transistors 405, 410, and 415 constitute three of the n transistors used in DAC 400. These transistors are typically metal oxide semiconductor field-effect transistors (MOSFET). The value of the drain current through any one of these transistors is determined by the applied gate voltage and the source-gate-drain geometry of the device. One of the parameters that determine the relationship between gate voltage and drain current is termed the width/length (W/L) ratio of the channels that define the source, drain, and gate inside the MOSFET. Typically, if a certain drain current is obtained for a particular value of gate voltage, the drain current can be doubled with the gate voltage remaining unchanged, if the (W/L) ratio of the MOSFET is doubled.

As an example, transistor 410 is a MOSFET with a drain current of ($I_0/2$) for a given gate voltage. The gate voltage in this case will be the digital bit that is one less than the MSB. Transistor 410 is shown in FIG. 4 as having a (W/L) ratio equal to ($2^{n-1}$ (W/L)). Transistor 405 has a gate voltage which is identical to the gate voltage applied to transistor 410, because it is equal to a second digital bit (the MSB). Therefore to obtain a drain current in transistor 405 equal to ($I_0$), which is double the drain current ($I_0/2$) through transistor 410, transistor 405 is typically configured to have a (W/L) equal to ($2^n$ (W/L)). This (W/L) ratio of transistor 405 is twice the (W/L) ratio of transistor 410.

Such an exponential scaling of transistor sizes to accommodate a range of digital input signal values, is undesirable for several reasons. For example, the component area of the DAC circuit when implemented inside an IC, using a set of identical transistors would be much smaller than the component area when using a set of binarily-sized transistors. Apart from the sub-optimal use of the substrate, the performance of the DAC is also compromised due to several factors. One such factor is increased parasitics, which leads to limitations in sampling speed and bandwidth constraints. A second factor relates to matching the electrical operating characteristics of each transistor to the others in the set of transistors. Typically, the accuracy of a DAC such as DAC 400, will be determined by how well the transistors are matched to one another in providing an accurate binary current-scaling relationship.

Given the shortcomings of the prior art reference voltage nodes and reference current nodes used in various circuits such as analog-to-digital converters and digital-to-analog converters, it is desirable to provide alternative systems and methods that address such shortcomings.

SUMMARY OF THE INVENTION

Embodiments of the present invention provide methods and systems for using a floating-gate MOSFETs as a programmable reference circuit. One example of a programmable reference circuit is a voltage reference source, while a second example of a programmable reference circuit is a reference current source.

Briefly described, in architecture, one embodiment of a system, among others, can be implemented as a floating-gate charge programmer used together with a first floating-gate field effect transistor that is programmable by the floating-gate charge programmer to store a first floating-gate charge and produce at least one of a first reference voltage and a first reference current that is proportional to the first floating-gate charge.

In one embodiment of a method, among others, can be broadly summarized by the following steps: providing a floating-gate field effect transistor; programming a charge into the floating-gate field effect transistor; and thereon using the floating-gate field effect transistor as at least one of a voltage reference and a current reference.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

Figures 1, 2:
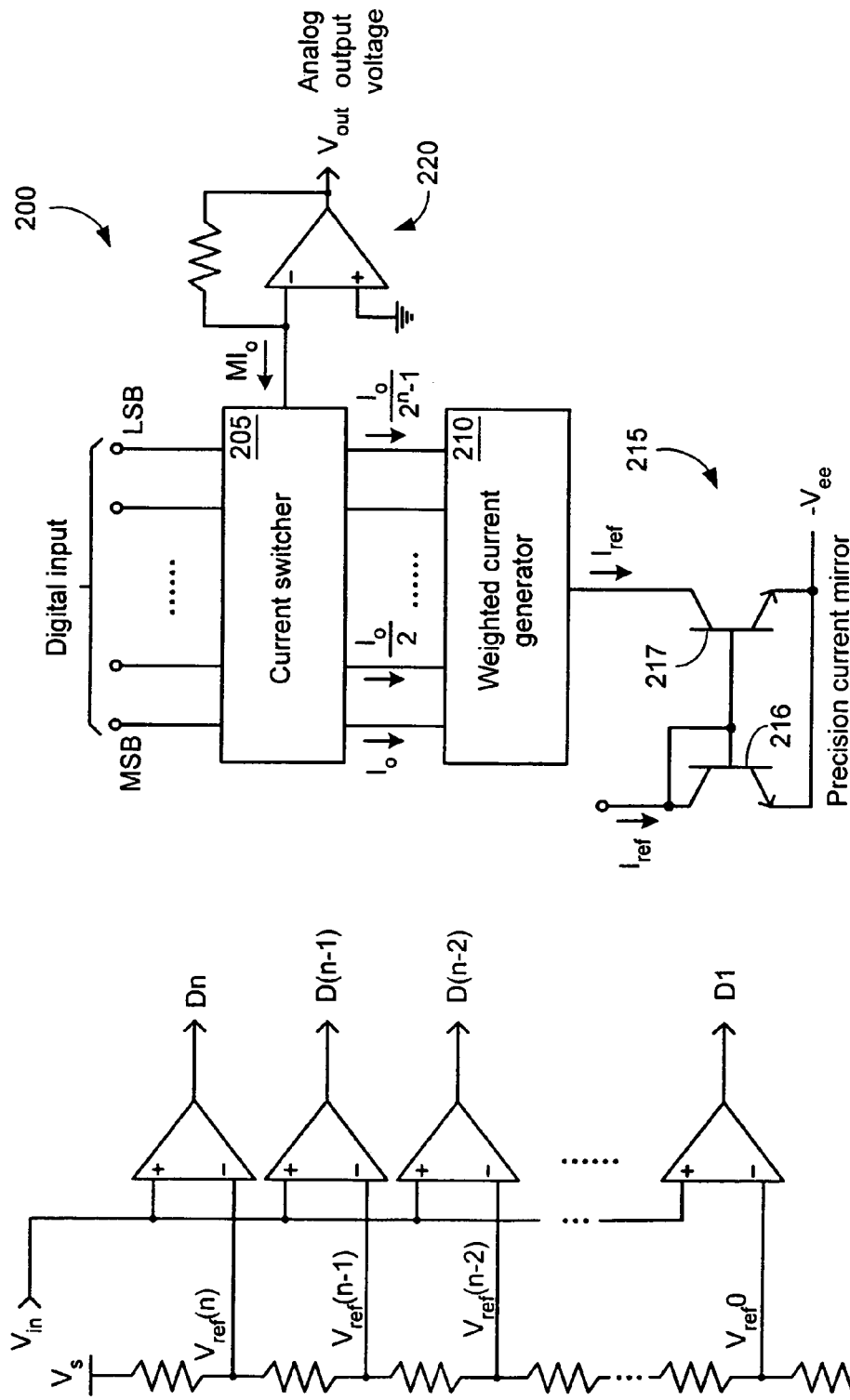
FIG. 1 is a block diagram of one embodiment of a prior-art analog-to-digital converter.
FIG. 2 is a block diagram of one embodiment of a prior-art digital-to-analog converter.
Figure 3:
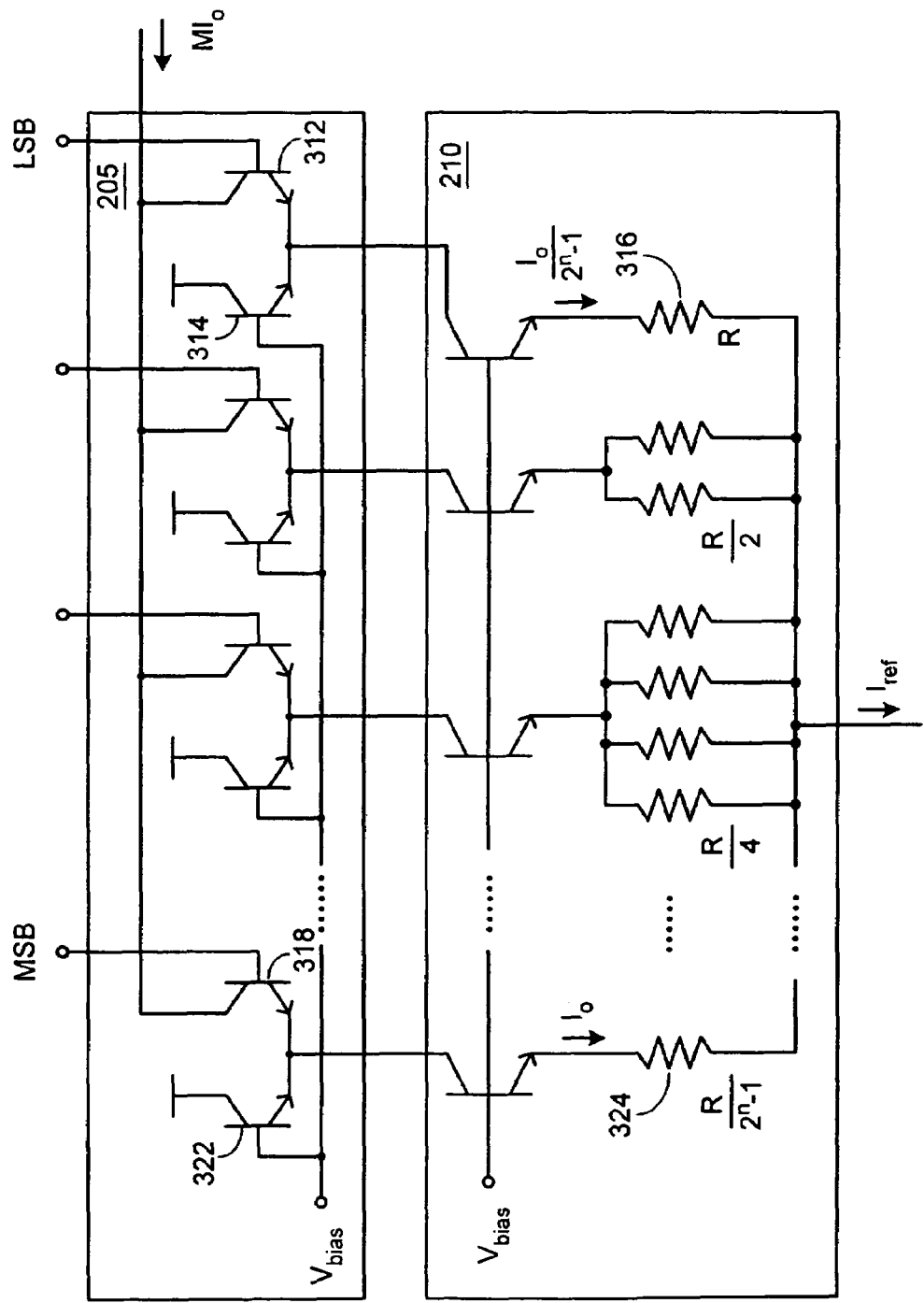
FIG. 3 is a schematic diagram of a current switcher block and a weighted current generator circuit that are used in the prior-art digital-to-analog converter of FIG. 2.
Figure 4:
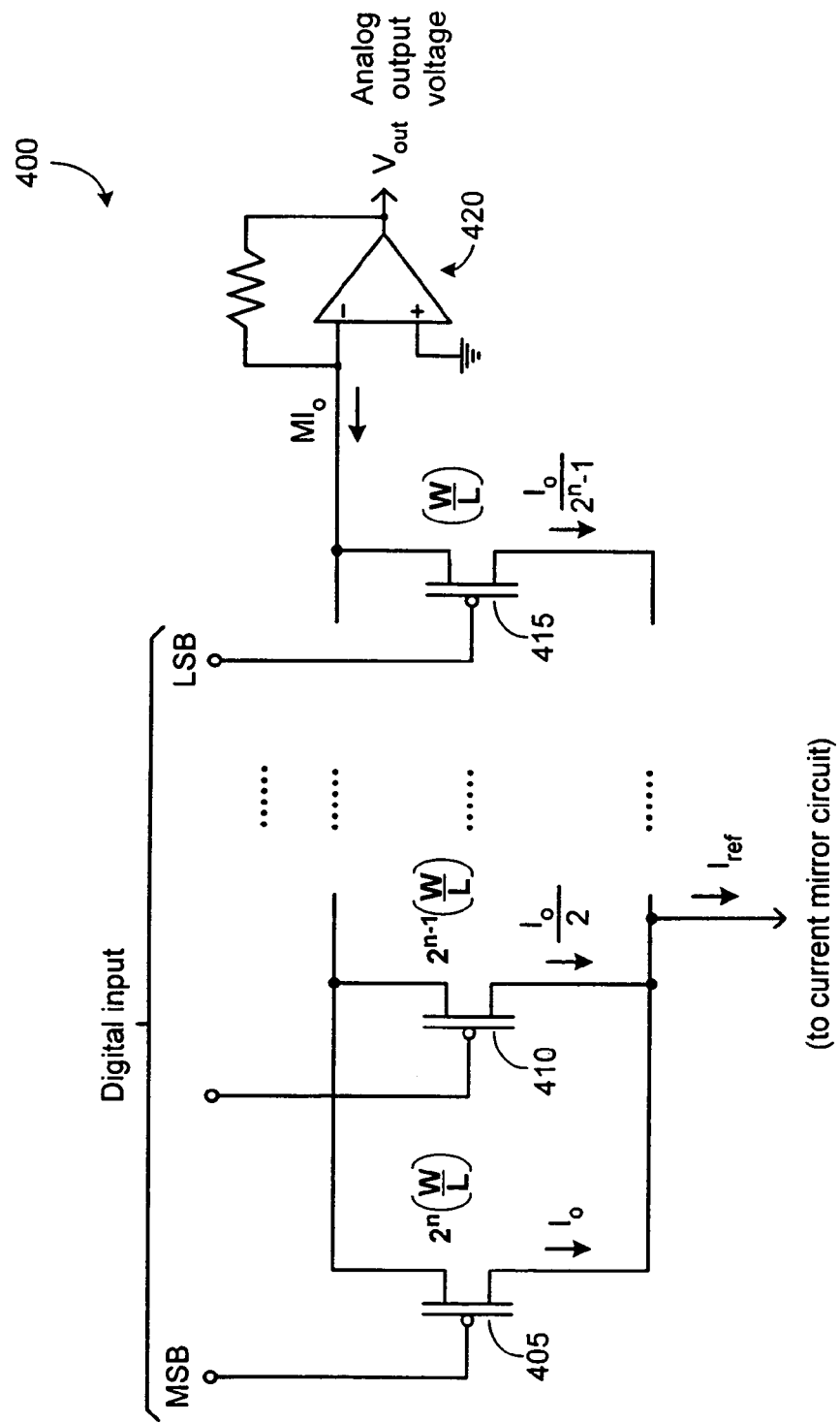
FIG. 4 is a block diagram of a second embodiment of a prior-art digital-to-analog converter.
Figures 5, 6:
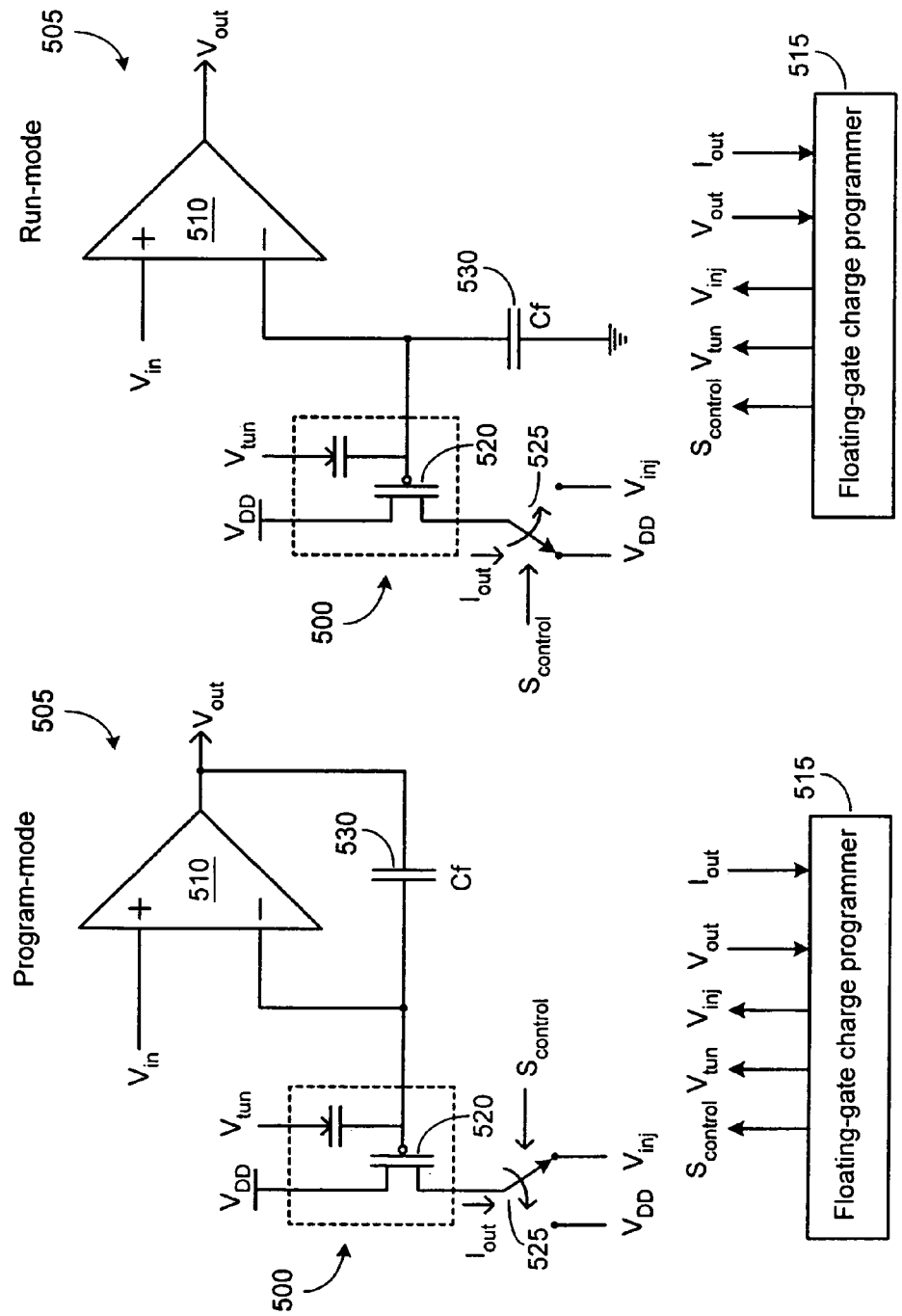
FIG. 5 is a circuit diagram of a reference circuit incorporating a programmable floating-gate MOSFET that is programmed using an exemplary system operating in a program-mode.
FIG. 6 is a circuit diagram of the reference circuit of FIG. 5 when the exemplary system of FIG. 5 is placed in a run-mode.

While the description below refers to certain exemplary embodiments, it is to be understood that the invention is not limited to these particular embodiments. On the contrary, the intent is to cover all alternatives, modifications and equivalents included within the spirit and scope of the invention as defined by the appended claims. Also, the terminology used herein is for the purpose of description and not of limitation. The description draws upon the following documents that are incorporated herein by reference in their entirety:

1) Investigations using floating-gate circuits for flash ADCs by Philomena Brady and Paul Hasler
2) Experimental Investigations of floating-gate circuits for delta-sigma modulators
   by Angelo Pereira, Philomena Brady, Abhishek Bandyopadhyay and Paul E. Hasler
3) Investigating Programmable Floating-Fate Digital-to-Analog Converter as Single Element or Element Arrays by G. Serrano, Matt Kucic, and Paul Hasler FIG. 5 is a circuit diagram of a reference circuit 500 incorporating a programmable floating-gate MOSFET 520 that is programmed using an exemplary system 505 operating in a program-mode. The program-mode of operation is implemented to program a charge into the floating-gate of floating-gate MOSFET 520, by using a floating-gate charge programmer 515.

Floating-gate MOSFET 520 contains a floating gate that is typically, but not necessarily, a polysilicon gate surrounded by $SiO_2$. When an inherent or externally-injected charge is present on the floating-gate, the charge is stored indefinitely because the floating-gate is surrounded by an insulator. The stored charge may be used to control the source-drain current flow in the floating-gate MOSFET 520, because the floating-gate charge behaves as a gate bias voltage.

Consequently, MOSFET 520 may be configured to operate as a reference voltage node and/or as a reference current source, by varying the amount of charge injected into the gate. Varying the amount of charge injected into the gate may be carried out as a one-time operation, as for example during manufacture of an IC that incorporates such a reference voltage source and/or a reference current source. It may also be carried out multiple times, as for example by a user incorporating such a variable reference voltage source and/or a variable reference current source in one or more of his circuit applications.

It will be noted that the term reference current source as used in this disclosure also encompasses applications where the same circuit may be used as a reference current sink. Persons of ordinary skill in the art will recognize that a current-oriented circuit can be operated interchangeably as a source or a sink, depending upon the manner in which such a circuit is connected to another circuit.

Drawing attention to FIG. 5, the source terminal of floating-gate MOSFET 520 is connected to a suitable supply voltage, the gate terminal is connected to an input terminal of voltage buffer 510, and the drain terminal is connected to a switch 525. Switch 525 is operated by floating-gate charge programmer 515 to connect the drain terminal of floating-gate MOSFET 520 to one of two voltages—an injection voltage Vinj that may also be provided by floating-gate charge programmer 515, or a supply voltage that is identical to the source terminal supply voltage. Floating-gate charge programmer 515 also provides a tunneling voltage Vtun into the floating-gate MOSFET 520.

Floating-gate charge programmer 515 comprises for example, voltage sources to provide Vtun and Vinj voltages, control logic to control one or more switches such as switch 525, voltage measurement circuitry to measure the floating-gate charge as well as other voltages, and current measurement circuitry to measure the source-drain current as well as other currents related to one or more MOSFETs such as MOSFET 500.

Capacitor 530 is connected as a negative-feedback capacitor to the voltage buffer 510. An input voltage is provided into the positive input terminal of voltage buffer 510. The output voltage Vout of voltage buffer 510 may be connected to other circuitry that uses a reference voltage circuit, and is also provided as a measurement voltage to floating-gate charge programmer 515.

When carrying out program-mode operation, floating-gate charge programmer 515 sets switch 525 to connect Vinj into the source terminal of floating-gate MOSFET 500. When floating-gate MOSFET 500 is a pFET, positive charge in the floating-gate may be increased by using Fowler-Nordheim tunneling to tunnel electrons off the floating-gate thereby increasing hole density. Negative charge in the floating-gate may be increased by using a hot-electron injection process carried out by injecting electrons via Vinj. While increasing positive charge at the floating-gate of the pFET causes the source-drain current to decrease, decreasing positive charge at the floating-gate of the pFET causes the source-drain current to increase.

A source-drain current measuring mechanism on the Vinj connection may also be used by the floating-gate programmer 515 to determine the appropriate amount of charge to be programmed into the floating-gate to obtain a desired value of source-drain current. This source-drain current is used when floating-gate MOSFET 500 is employed as a reference current source in various applications that will be explained using other figures.

The amplitude of the floating-gate charge is measured via voltage buffer 510. The voltage buffer 510 allows such a measurement with better accuracy than can be obtained by measuring the voltage directly at the floating-gate. The input voltage provided into the positive terminal of voltage buffer 510 allows the level of the output voltage Vout to be set to a value that is suitable for measurement in the floating-gate charge programmer 515.

It will be understood that several alternative connection schemes may be used to implement the circuit of FIG. 5. For example, switch 525 may be connected to the source terminal of floating-gate MOSFET 520 rather than the drain terminal of floating-gate MOSFET 520, and/or the gate terminal of floating-gate MOSFET 520 may be connected to the positive rather than the negative input terminal of voltage buffer 505. The polarity and amplitude of the supply voltages connected to the drain and/or source may also be suitably altered without significantly changing the operating characteristics of floating-gate MOSFET 520.

FIG. 6 is a circuit diagram of the reference circuit 500 of FIG. 5 when the exemplary system 505 of FIG. 5 is placed in a run-mode. In the run-mode of operation, the terminal of capacitor 530 that was connected to the output of voltage buffer 510 in FIG. 5, is now connected to ground. This connection allows capacitor 530 to operate as an auxiliary storage element connected in parallel to the floating-gate charge inside floating-gate MOSFET 520.

Floating-gate charge programmer 515 is used to activate switch 525 that consequently connects the drain terminal of floating-gate MOSFET 500 to a supply voltage that is identical to the supply voltage that is connected to the source terminal of floating-gate MOSFET 500. As a result of this connection, floating-gate MOSFET 500 is placed in a non-conducting state and the floating-gate terminal may now be used as a reference voltage node.

Voltage buffer 510 allows floating-gate MOSFET 500 to be used as a reference voltage node without undue loading of the floating-gate. Such a loading may occur if an external circuit were connected directly to the floating-gate. It will be understood that the use of voltage buffer 510 is optional, and in several applications the floating-gate charge may be used directly as a reference voltage when floating-gate MOSFET 500 is used as a reference voltage node. The use of floating-gate MOSFET 500 as a voltage reference node and/or a reference current source will be explained further using other figures.

In general, the method for providing a voltage reference node and/or a reference current source may be understood by implementing the following procedure:

A drain terminal (or alternatively, a source terminal) of a floating-gate MOSFET is connected to a supply voltage (Vdd when the drain terminal is used; Vss when the source terminal is used). The source terminal (or alternatively the drain terminal) of the MOSFET is connected to an injection voltage source. The charge in the floating-gate is programmed by selectively using a tunneling process and a hot-electron injection process. The output voltage from the voltage buffer is measured to obtain a measurement of the charge. If this output voltage is not appropriate, the tunneling/hot-electron injection process voltage is iteratively continued until the desired level of charge has been programmed.

Once the charge in the gate has been suitably programmed, the source terminal may be disconnected from the injection voltage source and connected to the same supply voltage as the drain terminal. This places the MOSFET in a non-conducting state because both source and drain terminals are at identical voltage potential. The programmed gate terminal of the MOSFET is then used as a reference voltage node. If the MOSFET is to be used as a reference current source, the source terminal can be connected to a supply voltage that biases the source terminal appropriately, and allows the source-drain reference current to flow.

With reference to the method explained above, it will be understood that the drain and source terminals of the MOSFET may be used interchangeably used with appropriate supply voltage biasing and connection of the injection voltage to provide the floating-gate charge at the gate terminal. Also, while a voltage buffer has been used to measure the charge, a current measurement carried out by measuring the source-drain current of the MOSFET may be used as an alternative way to measure the programmed charge.

Figure 7:
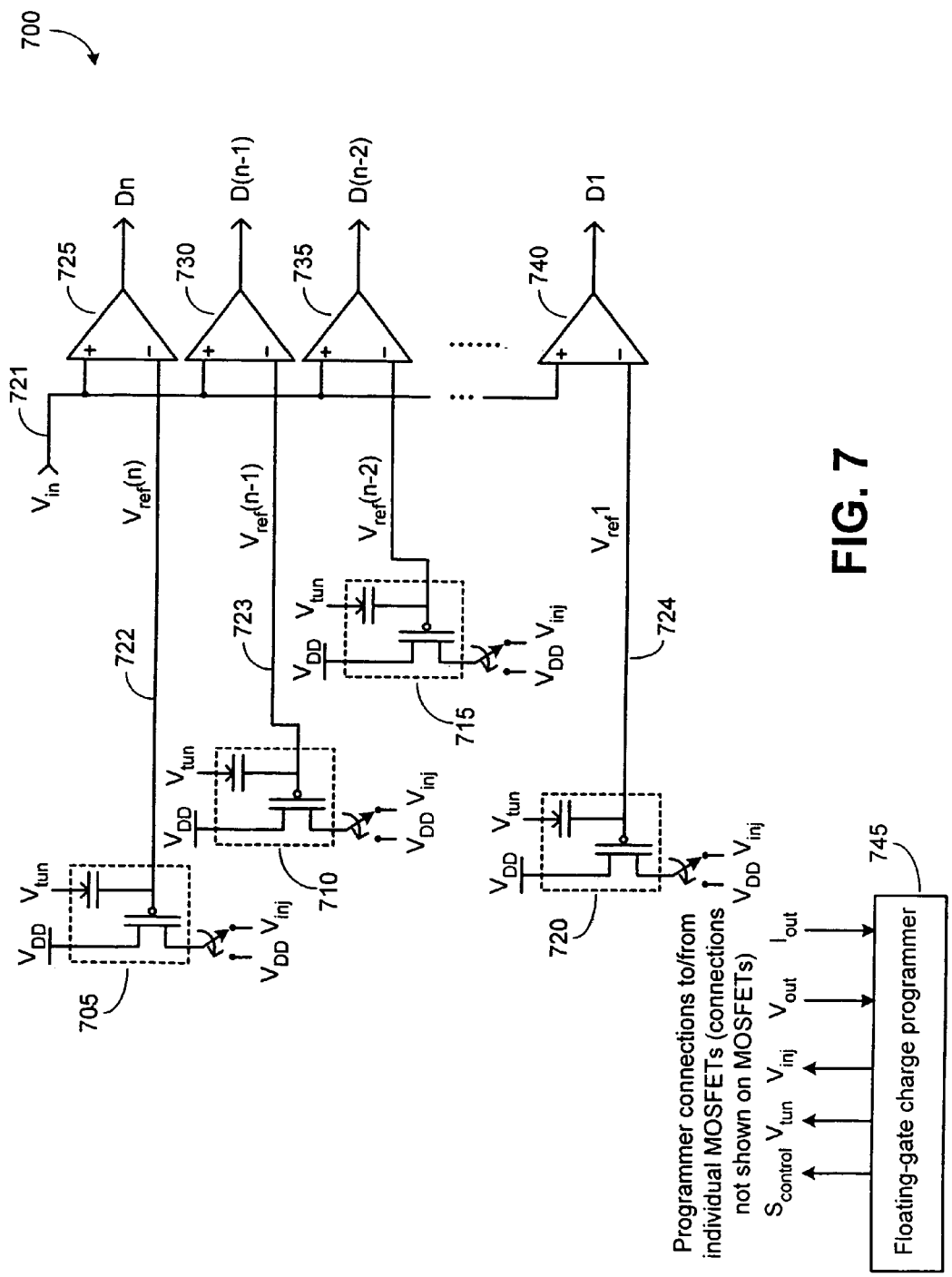
FIG. 7 is a block diagram of an exemplary embodiment of a programmable analog-to-digital converter (ADC) incorporating a programmable floating-gate MOSFET, such as the floating-gate MOSFET illustrated in FIGS. 5 and 6.

FIG. 7 is a block diagram of an exemplary embodiment of a programmable analog-to-digital converter (ADC) 700 incorporating one or more floating-gate MOSFETs, such as the floating-gate MOSFET 500 described using FIGS. 5 and 6. The floating-gate MOSFETs, which are programmed using floating-gate charge programmer 745, are used as reference voltage nodes in this example application. While the exemplary ADC is shown configured as a flash ADC, the use of floating-gate MOSFETs as reference voltage nodes is applicable to a wide variety of ADC systems such as, but not limited to, successive-approximation, dual-slope integration, and staircase ADC systems.

ADC 700 includes n voltage comparators, where n is the number of digital bits that are output by ADC 700. The value of n defines the resolution that can be provided by ADC 700 to an analog input signal that is connected via line 721 into like-polarity input terminals of the n voltage comparators. In a typical system, the n digital bits are connected into an encoder circuit that produces a unique binary output combination for each of the combinations of the n digital bits.

ADC 700 also includes n floating-gate MOSFETs configured as reference voltage nodes. Each of the n floating-gate MOSFETs is individually connected into like-polarity input terminals of the n voltage comparators. These like-voltage polarity terminals are of opposite polarity to the like-polarity input terminals into which the analog input signal is connected. For example, floating-gate MOSFET 705 is connected into the negative polarity input terminal of voltage comparator 725, while the analog input signal is connected into the positive polarity input terminal of voltage comparator 725. The analog input signal is also connected into the positive polarity input terminals of the other voltage comparators.

While FIG. 7 shows the gate terminal of each MOSFET directly connected to a voltage comparator, it will be understood that a buffer/driver may be optionally used between the gate terminal and the comparator to minimize loading of the charge in the gate terminal by the comparator. Also, for the sake of brevity, the connections between the individual MOSFETs and the floating-gate charge programmer 745 are not shown in FIG. 7. It will be understood that a circuit such as the one described using FIGS. 5 and 6 may be employed to interface the floating-gate charge programmer 745 to the n MOSFETs.

The operation of ADC 700 may be illustrated by using some sample reference voltage values. For example, let it be assumed that floating-gate MOSFET 705 has been programmed to provide a reference voltage of 5.0 V; floating-gate MOSFET 710 has been programmed to provide a reference voltage of 4.0 V; floating-gate MOSFET 715 has been programmed to provide a reference voltage of 3.0 V; and the remaining floating-gate MOSFETs (not shown) have been programmed to provide a difference of 1.0V between adjacent MOSFETs. In this example, if the amplitude of the analog input voltage is 3.5V, voltage comparators 725 and 730 produce zero/low digital output states, because the amplitude of the analog input voltage is lower than the reference voltages fed into the corresponding negative input terminals of these two comparators. All other voltage comparators produce a one/high digital output state, because the amplitude of the analog input voltage is higher than the reference voltages fed into the corresponding negative input terminals of these comparators. The digital output bits (D1 through Dn) are then encoded by the encoder (not shown) to produce a unique binary value corresponding to the 3.5V analog input voltage.

If the analog input voltage is now changed to 4.1V, only comparator 725 produces a zero/low digital output, while all other comparators, including comparator 730, produce one/high digital output states. The new set of digital output bits (D1 through Dn) are then encoded by the encoder (not shown) to produce a second unique binary value corresponding to the 4.2V analog input voltage.

In the example illustrated above, the difference in reference voltages provided by adjacent floating-gate MOSFETs was described as a constant 1.0V, thereby causing ADC 700 to respond to varying amplitudes of the input analog voltage in a linear manner. If a non-linear response is desired, the floating-gate MOSFETs may be programmed to provide suitable reference voltages that have non-linear values between adjacent floating-gate MOSFETs. For example, floating-gate MOSFET 705 may be programmed to provide a reference voltage of 5.0 V; floating-gate MOSFET 710 may be programmed to provide a reference voltage of 4.3 V; floating-gate MOSFET 715 may be programmed to provide a reference voltage of 3.1 V; and the remaining floating-gate MOSFETs (not shown) may be programmed with appropriate voltages.

It will be understood that this flexibility in programming, permits ADC 700 to operate in a variety of operating modes that are optionally programmable by an end-user. Such modes of operation encompass ADC responses that are non-linear, such as but not limited to, exponential, logarithmic, claw, and A-law responses. Programming also permits better ADC accuracy, because it permits certain types of device errors to be compensated.

This flexibility in ADC programming is in contrast to ADC devices that are "hardwired" during manufacture to provide one unique mode of operation. Hardwiring refers to the use of components such as resistors in resistive divider chains.

Figure 8:
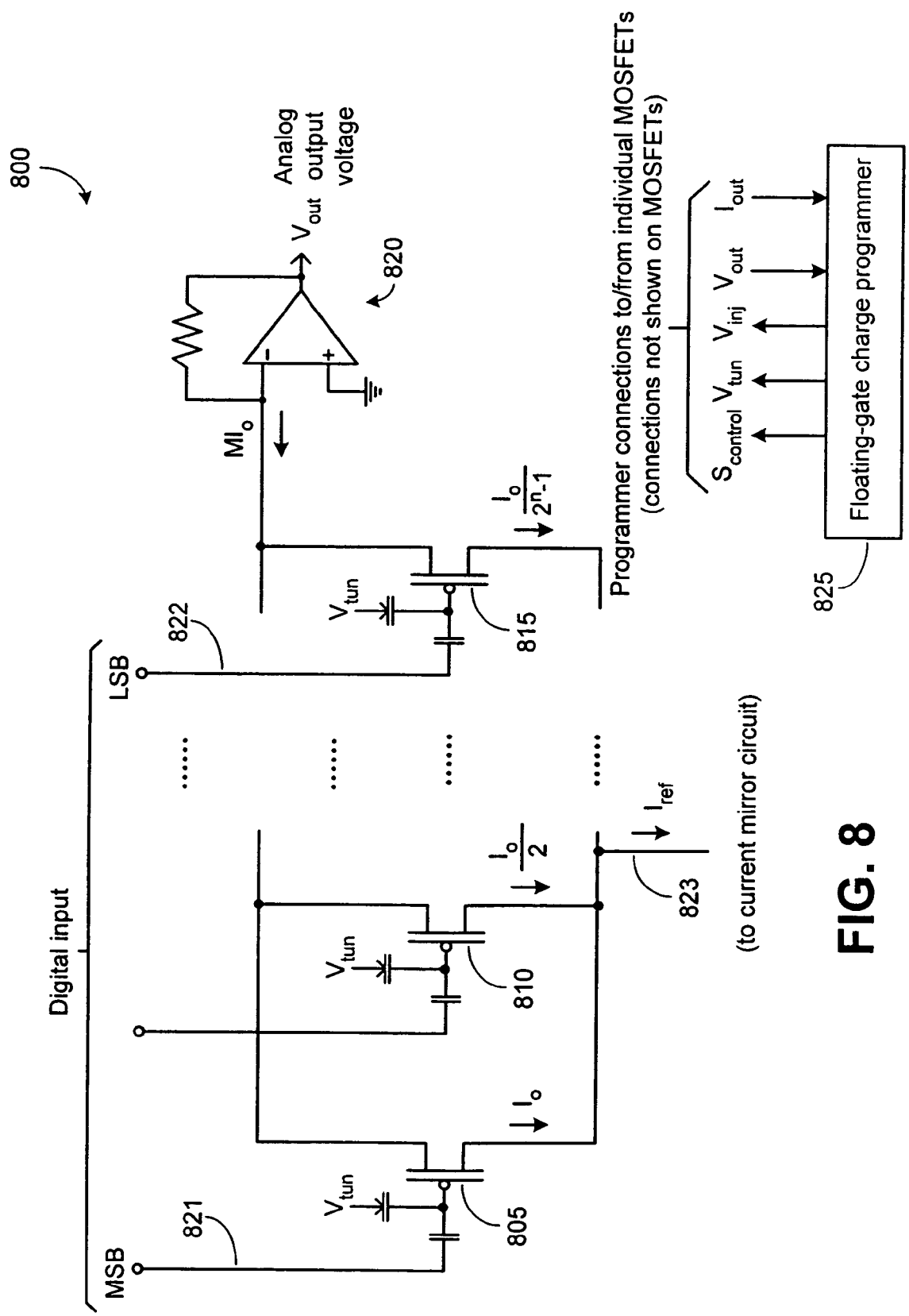
FIG. 8 is a block diagram of an exemplary embodiment of a programmable digital-to-analog converter (DAC) incorporating a programmable floating-gate MOSFET, such as the floating-gate MOSFET illustrated in FIGS. 5 and 6.

FIG. 8 is a block diagram of an exemplary embodiment of a programmable digital-to-analog converter (DAC) 800 incorporating one or more floating-gate MOSFETs, such as the floating-gate MOSFET illustrated in FIGS. 5 and 6. The floating-gate MOSFETs, which are programmed using floating-gate charge programmer 825, are used as reference current sources in this example application. While the DAC is shown configured in one exemplary configuration, the use of floating-gate MOSFETs as reference current sources is applicable to a wide variety of DAC systems.

DAC 800 accepts a multi-bit digital input signal and produces an analog output voltage that reflects the state of the digital input signal. DAC 800 uses n binarily weighted current sources $I_0$, $I_0/2$, $I_0/2^1$, $I_0/2^2$, ... $I_0/2^{n-1}$ that are switched to the output by n floating-gate MOSFETs 805, 810, ... and 815. The MSB of the digital input signal determines the state of floating-gate MOSFET 805 that switches the $I_0$ current, while the LSB of the digital input signal determines the state of floating-gate MOSFET 815 that switches the $I_0/2^{n-1}$ current. The analog output current $MI_0$, which is the sum of the currents through floating-gate MOSFETs 805, 810, ... and 815 for any particular digital input signal, is usually converted into the analog output voltage by an amplifier 820. Analog output current $MI_0$ is related to $I_{ref}$ the reference current carried on line 823 that is generated by a current mirror circuit (not shown). The current mirror circuit will be explained with reference to another figure.

The n weighted current sources $I_0$, $I_0/2$, $I_0/2^1$, $I_0/2^2$, ... $I^0/2^{n-1}$ can alternatively, have a non-binary relationship. For example, the individual currents can bear an exponential, logarithmic, or a square-law relationship to one another.

The amplitude of the source-drain current through any one of the floating-gate MOSFETs 805, 810, ... and 815 is determined by the charge programmed into the floating-gate of the floating-gate MOSFET. The physical characteristics, such as the width-length geometry of each of the floating-gate MOSFETs 805, 810, . . . 815 is manufactured to be identical to one another, thereby providing several advantages such as producing a good device-to-device match. This matching allows scaling of the binary or non-binary, source-drain currents to be carried out accurately.

It will also be understood, that where such device-to-device matching is less than optimal, the gate charge on the individual MOSFETs may be suitably programmed to offset the mismatch, thereby providing greater accuracy in scaling the multiplicity of source-drain currents using binary as well as non-binary relationships. For example, if MOSFET 805 required a gate voltage of 1V to produce a reference current of 1A, and a gate voltage of 0.5V to produce a reference current of 0.5A, MOSFET 810 that may not be identical to MOSFET 805, may be provided with a "compensated" gate voltage of 0.6V rather than 0.5V, to produce the desired reference current of 0.5A.

Figure 9:
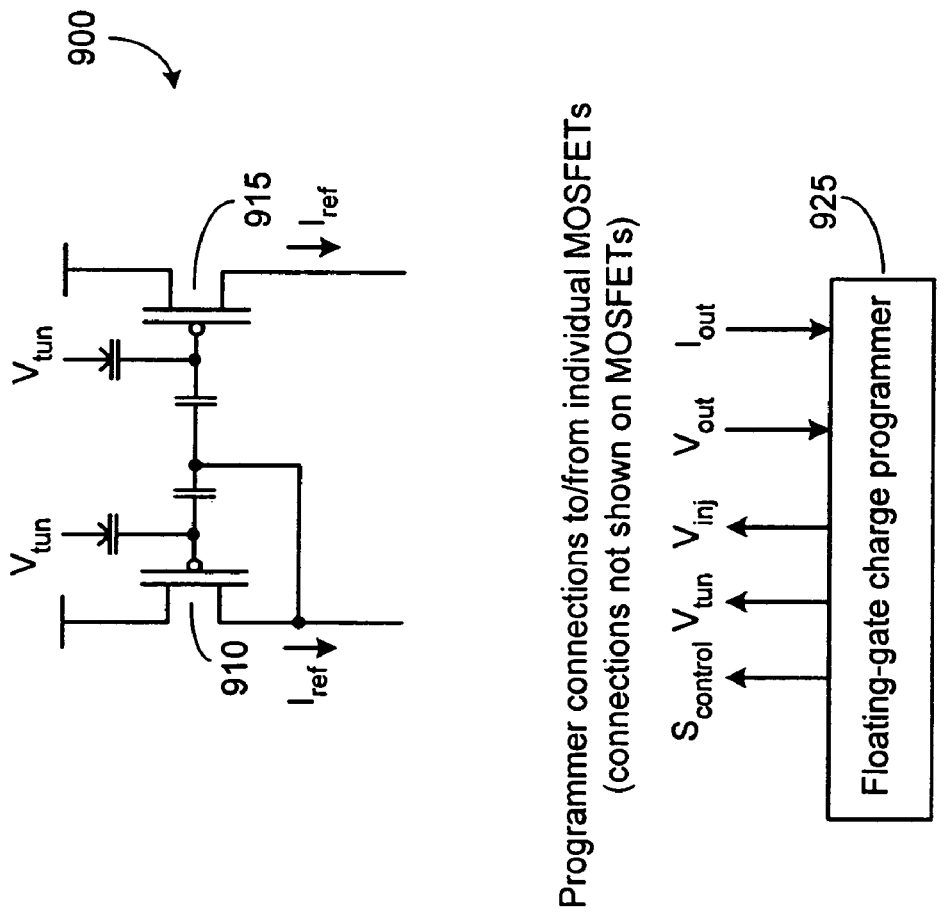
FIG. 9 is a block diagram of an exemplary embodiment of a programmable current-mirror circuit that incorporates a programmable floating-gate MOSFET, such as the floating-gate MOSFET of FIGS. 5 and 6. The current mirror circuit is a part of the digital-to-analog converter of FIG. 8.

FIG. 9 illustrates an exemplary programmable current-mirror circuit 900 such as the current-mirror circuit used in FIG. 8. Current-mirror circuit 900 includes a pair of floating-gate MOSFETs 910 and 915. The gate terminal of MOSFET 910 is connected to the gate terminal of MOSFET 915, thereby causing the source-drain current of MOSFET 910 to be "mirrored" by the source-drain current of MOSFET 915. The source-drain current of MOSFET 910 is determined by the charge programmed into the floating-gate of MOSFET 910 by floating-gate charge programmer 925.

Consequently, MOSFET 910 operates as a programmable reference current source that defines the source-drain current of MOSFET 915. While FIG. 9 indicates that the two Iref currents are identical, it will be understood that the two currents may be configured to have other linear as well as non-linear relationships, by suitable addition of resistors in the source-drain path of one or both MOSFETs.

It will also be understood that the MOSFETs can be individually programmed to allow the two MOSFETs to bear a non-linear operational relationship to each other. Additional an input signal, such as a digital signal and/or an analog signal, may also be incorporated into circuit 900, or similar circuits, to permit interaction of the input signal with one or more reference currents through the two MOSFETs.

Figure 10:
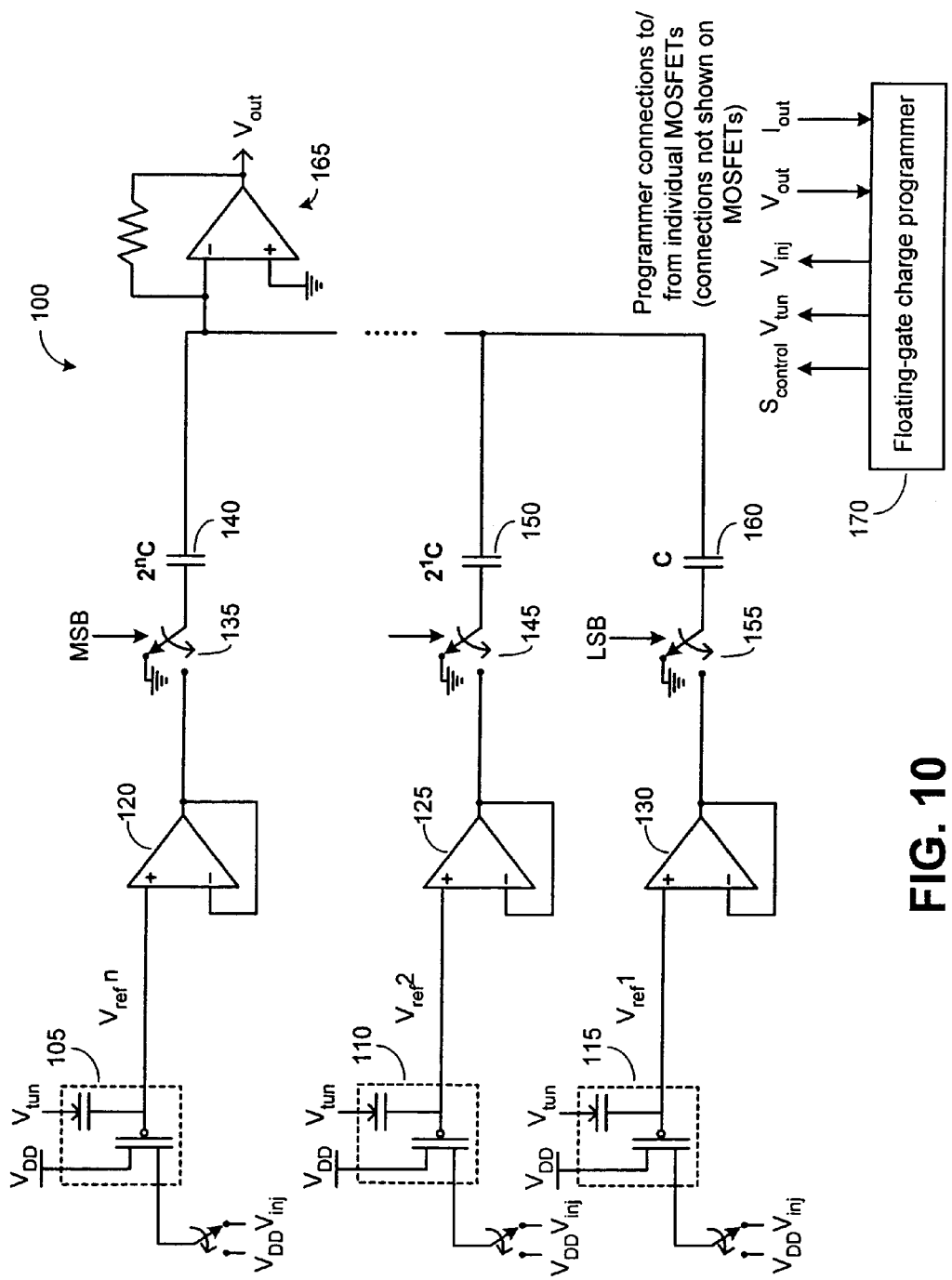
FIG. 10 is a block diagram of a second exemplary embodiment of a programmable digital-to-analog converter incorporating a programmable floating-gate MOSFET, such as the floating-gate MOSFET of FIGS. 5 and 6.

FIG. 10 is a block diagram of a second exemplary embodiment of a programmable digital-to-analog converter (DAC) 100 incorporating one or more floating-gate MOSFETs, such as the floating-gate MOSFET illustrated in FIGS. 5 and 6. The floating-gate MOSFETs, which are programmed using floating-gate charge programmer 170, are used as reference voltage nodes in this example application. DAC 100 accepts a multi-bit digital input signal and produces an analog output voltage Vout that reflects the state of the digital input signal.

DAC 100 uses n capacitors in a capacitor ladder network that is shown in FIG. 10 as having a binary relationship between one another in their capacitance values. Specifically, capacitor 160 is shown as having a capacity C, while capacitor 150 has a capacity of $2^1 C$, and capacitor 140 has a capacity of $2^n C$. Switches 135, 145, and 155 are three of n switches. The individual switch states are determined by the values of the digital inputs. For example, the MSB of the digital input determines the switch state of switch 135, while the LSB of the digital input determines the switch state of switch 155.

The n capacitors are charged by n MOSFETS 105, 110, . . . and 115 depending upon the state of the switch that connects each of the MOSFETs to the corresponding capacitor. The charges contained in one or more of the n capacitors are subsequently summed by amplifier 165. Amplifier 165 provides Vout, which is the analog representation of the digital input signal.

MOSFETs 105, 110, and 115 may be programmed to bear a linear and/or a non-linear relationship to one another, thereby causing DAC 100 to output an analog signal that bears a linear or a non-linear relationship to the digital input.

Figure 11:
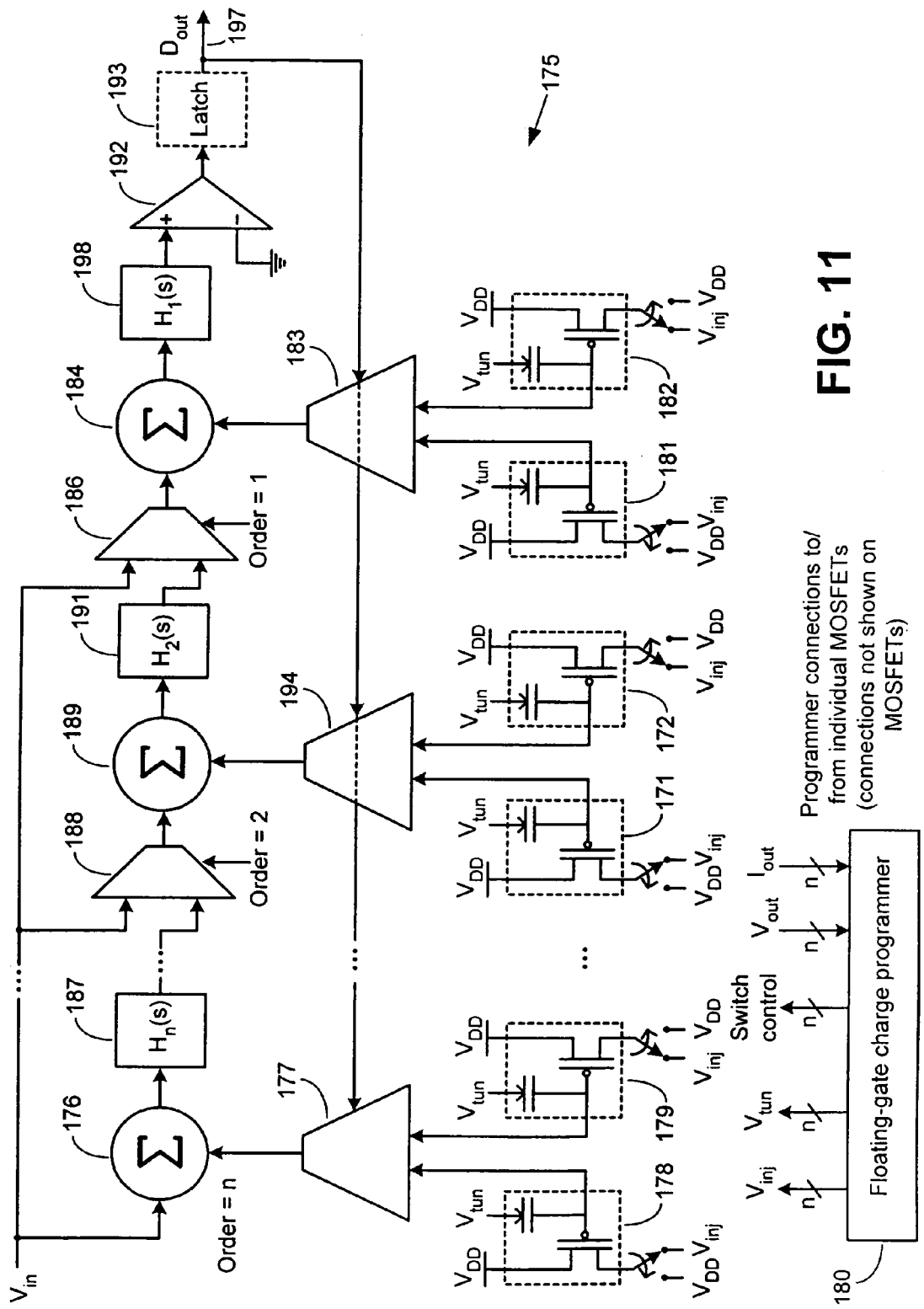
FIG. 11 is a block diagram of an exemplary embodiment of a sigma-delta analog-to-digital converter circuit that incorporates a programmable floating-gate MOSFET, such as the floating-gate MOSFET of FIGS. 5 and 6.

FIG. 11 is a block diagram of an exemplary embodiment of a sigma-delta analog-to-digital converter circuit that incorporates the programmable floating-gate reference circuit of FIGS. 5 and 6. While FIG. 11 illustrates an $n^{th}$-order, 1-bit sigma-delta converter circuit that is also referred to as a sigma-delta converter circuit, the following description is also applicable to several other converter circuits, including n-bit converters that utilize a voltage reference node or a reference current source. Also, while FIG. 11 illustrates a 1-bit over-sampling converter circuit, the example provided in this description may be extended to multi-bit implementations as well.

Converter 175 accepts an analog input voltage through line 196 and outputs a 1-bit digital output on line 197. This 1-bit digital output is compared with the input voltage by using a feedback loop comprised of several multiplexers, combiners, and signal transform blocks. When the signal transform block is an integrator circuit, the integrated result of the comparison is used to generate a subsequent 1-bit digital output on line 197. The digital output on line 197 consequently comprises a stream of "ones" and "zeros" that represent the analog input voltage as a ratio of "ones" and "zeros."

Converter 175 comprises 2n floating-gate MOSFETs that are individually programmable using floating-gate charge programmer 180. The MOSFETs are used as reference voltage nodes in this example application. Line 197 is connected to n 2-input multiplexers 183, 194, . . . and 177 that are connected to n combiners 184, 189, . . . and 176. The output of each combiner is connected to a signal transform block. Transform block 198 connects into an output comparator 192 that in turn connects into an optional latch 193 that drives line 197. Other than transform block 198, the outputs of each of the other remaining transform blocks 191 . . . 187, are individually connected into a first input of (n−1) 2-input multiplexers 186.188. The analog input signal on line 196 is provided into the second input of each of the (n−1) 2-input multiplexers 186.188.

The value of n, which determines the $n^{th}$-order of operation of the $n^{th}$-order, 1-bit sigma-delta modulator circuit, is determined by the logic (logic controller not shown) present on the control lines 156 and 157 (other lines not shown) of the (n−1) 2-input multiplexers 186 . . . 188. For example, to configure the $n^{th}$-order, 1-bit sigma-delta modulator circuit as a first-order 1-bit converter, the logic present on control line 156 of multiplexer 186 is set to route the analog input signal on line 196 into the combiner 184. Such a configuration effectively prevents the $2^{nd}$-order input from transform block 191, as well as the higher-order inputs from other transform blocks, from appearing at combiner 184.

To increase the order of operation to 2, the logic present on control line 156 of multiplexer 186 is suitably selected to route the signal from transform block 191 into the combiner 184, while the logic present on control line 157 of multiplexer 188 is suitably selected to route the analog input signal on line 196 into the combiner 189.

The logic state of the 1-bit digital output on line 197 that is connected to the n 2-input multiplexers 183, 194, . . . and 177, determines which of the two MOSFETs connected to the multiplexers are routed to each of the respective combiners. For example, if the logic state is one/high, MOSFETs 182, 172, . . . and 179, may be routed through multiplexers 183, 194, . . . and 177; and if the logic state is zero/low MOSFETs 181, 171, . . . and 178, may be routed through multiplexers 183, 194, . . . and 177.

The reference voltage values provided by the 2n MOSFETs are programmed using the floating-gate charge programmer 180. Programming may be carried out to individually or collectively program the floating-gate charge inside each of the 2n MOSFETs. These reference voltage values determine the coefficients of the feedback loop of the converter 175. These coefficients are used for signal transformation such as integration and/or filtering, in the transform blocks 191 . . . and 187.

It will be understood that the floating gate charges may be modified in a one-time manner, repetitively, randomly, recursively, or in other dynamic sequences, thereby allowing the operating characteristics of the converter 175 to be alterable statically or dynamically. This flexibility in changing operating characteristics of the converter 175 provides several advantages. For example, it allows the loop gain to be optimized while ensuring accuracy and stability of operation for a given range of analog input signal amplitudes.

Various aspects of the subject-matter described herein are set out non-exhaustively in the following numbered clauses:

1. A system comprising:
    a floating-gate charge programmer; and
    a first floating-gate field effect transistor that is programmable by the floating-gate charge programmer to store a first floating-gate charge and produce at least one of a first reference voltage and a first reference current that is proportional to the first floating-gate charge.
2. The system of clause 1, wherein the first floating-gate field effect transistor is a part of a voltage comparator circuit.
3. The system of clause 1, further comprising a voltage comparator, wherein the first reference voltage is connected into a first input of the voltage comparator, an analog input signal is connected into a second input of the voltage comparator, and wherein the voltage comparator produces an output signal that is a digital representation of the difference in amplitudes between the first reference voltage and the analog input signal.
4. The system of clause 3, further comprising an analog-to-digital converter, wherein the voltage comparator is one of a plurality of voltage comparators, and the first floating-gate field effect transistor is one of a plurality of floating-gate field effect transistors that are used to produce a plurality of reference voltages.
5. The system of clause 4, wherein the analog-to-digital converter comprises a delta-sigma modulator that oversamples an input analog signal to produce a digital output signal that is representative of the input analog signal.
6. The system of clause 1, further comprising a digital-to-analog converter containing a second floating-gate field effect transistor that is programmable by the floating-gate charge programmer to store a second floating-gate charge and produce at least one of a second reference voltage and a second reference current that is proportional to the second floating-gate charge.
7. The system of clause 6, wherein the digital-to-analog comprises a summing amplifier that combines at least one of the first reference voltage and the first reference current when enabled by a first digital logic, with at least one of the second reference voltage and the second reference current when enabled by a second digital logic, to produce an analog signal that is representative of the digital logic combination of the first and second digital logic.
8. The system of clause 7, wherein the amplitude of the first reference voltage has a binary relationship to the amplitude of the second reference voltage.
9. The system of clause 7, wherein the amplitude of the first reference current has a binary relationship to the amplitude of the second reference current.
10. The system of clause 1, further comprising a second floating-gate field effect transistor that is connected to the first floating-gate field effect transistor to form a current-mirror circuit wherein the source-drain current of the second floating-gate field effect transistor is proportional to the source-drain current of the first floating-gate field effect transistor.
11. The system of clause 1, further comprising a second floating-gate field effect transistor that is connected to the first floating-gate field effect transistor to form a current-summing circuit wherein the output current of the current-summing circuit is proportional to the sum of the source-drain currents of the first and the second floating-gate field effect transistors.
12. The system of clause 1, wherein the floating-gate charge programmer comprises:
    means to remove charge from a floating-gate of the first floating-gate field effect transistor, the charge being removed by hot-electron injection; and
    means to add charge to the floating-gate of the first floating-gate field effect transistor, the charge being added by tunneling.
13. The system of clause 12, wherein the floating-gate charge programmer comprises means to measure charge stored in the floating-gate of the first floating-gate field effect transistor.
14. A system comprising:
    a flash analog-to-digital converter containing a plurality of voltage comparators;
    a first floating-gate field effect transistor connected to a first voltage comparator in the plurality of voltage comparators, the first floating-gate field effect transistor being programmable to store a first floating-gate charge and produce a first reference voltage output that is proportional to the first floating-gate charge.
15. The system of clause 14, further comprising a second floating-gate field effect transistor connected to a second voltage comparator in the plurality of voltage comparators, the second floating-gate field effect transistor being programmable to store a second floating-gate charge and produce a second reference voltage that is proportional to the second floating-gate charge.
16. The system of clause 15, further comprising a third floating-gate field effect transistor connected to a third voltage comparator in the plurality of voltage comparators, the third floating-gate field effect transistor being programmable to store a third floating-gate charge and produce a third reference voltage output that is proportional to the third floating-gate charge.
17. The system of clause 16, wherein the first voltage reference output, the second voltage reference output, and the third voltage reference output provide a logarithmic change in voltage reference amplitudes for a flash analog-to-digital conversion in the flash analog-to-digital converter.
18. The system of clause 16, wherein the first voltage reference output, the second voltage reference output, and the third voltage reference output provide a sigma-delta change in voltage reference amplitudes for a flash analog-to-digital conversion in the flash analog-to-digital converter.

19. A method of providing a reference, the method comprising:
  providing a floating-gate field effect transistor;
  programming a charge into the floating-gate field effect transistor; and
  using the floating-gate field effect transistor as at least one of a voltage reference and a current reference.

20. The method of clause 19, wherein programming the charge into the floating-gate field effect transistor comprises:
  connecting a gate terminal of the floating-gate field effect transistor to a first input terminal of a voltage buffer;
  connecting an input voltage signal to a second input terminal of the voltage buffer;
  providing a feedback capacitor that capacitively couples an output voltage of the voltage buffer to the gate terminal of the floating-gate field effect transistor;
  selectively providing one of a hot-electron charge injection process and a tunneling process to the floating-gate field effect transistor to adjust the amplitude of charge stored in the floating-gate field effect transistor to a desired amplitude; and
  measuring the output voltage of the voltage buffer to determine the amplitude of charge stored in the floating-gate field effect transistor.

21. The method of clause 20, wherein upon programming the charge into the floating-gate field effect transistor, further configuring the floating-gate field effect transistor as a voltage reference comprises:
  disconnecting a lead of the feedback capacitor that is connected to the output terminal of the voltage comparator; and
  connecting the lead of the feedback capacitor to a ground potential.

22. A method of providing a reference, the method comprising:
  providing a floating-gate field effect transistor;
  connecting a drain terminal of the floating-gate field effect transistor to a first supply voltage;
  connecting a source terminal of the floating-gate field effect transistor to an injection voltage source;
  selectively providing one of a hot-electron charge injection process and a tunneling process to the floating-gate field effect transistor to adjust the amplitude of charge stored in the floating-gate field effect transistor to a desired amplitude;
  disconnecting the source terminal of the floating-gate field effect transistor from the injection voltage source;
  connecting the source terminal of the floating-gate field effect transistor to the first supply voltage; and
  using the floating-gate field effect transistor as a reference voltage node.

23. A method of providing a reference, the method comprising:
  providing a floating-gate field effect transistor;
  connecting a drain terminal of the floating-gate field effect transistor to a first supply voltage;
  connecting a source terminal of the floating-gate field effect transistor to an injection voltage source;
  selectively providing one of a hot-electron charge injection process and a tunneling process to the floating-gate field effect transistor to adjust the amplitude of charge stored in the floating-gate field effect transistor to a desired amplitude;
  disconnecting the source terminal of the floating-gate field effect transistor from the injection voltage source;
  connecting the source terminal of the floating-gate field effect transistor to a second supply voltage; and
  using the floating-gate field effect transistor as a reference current source.

24. A method of providing a reference, the method comprising:
  providing a floating-gate field effect transistor;
  connecting a source terminal of the floating-gate field effect transistor to a first supply voltage;
  connecting a drain terminal of the floating-gate field effect transistor to an injection voltage source;
  selectively providing one of a hot-electron charge injection process and a tunneling process to the floating-gate field effect transistor to adjust the amplitude of charge stored in the floating-gate field effect transistor to a desired amplitude;
  disconnecting the drain terminal of the floating-gate field effect transistor from the injection voltage source;
  connecting the drain terminal of the floating-gate field effect transistor to the first supply voltage; and
  using the floating-gate field effect transistor as a reference voltage node.

25. A method of providing a reference, the method comprising:
  providing a floating-gate field effect transistor;
  connecting a source terminal of the floating-gate field effect transistor to a first supply voltage;
  connecting a drain terminal of the floating-gate field effect transistor to an injection voltage source;
  selectively providing one of a hot-electron charge injection process and a tunneling process to the floating-gate field effect transistor to adjust the amplitude of charge stored in the floating-gate field effect transistor to a desired amplitude;
  disconnecting the drain terminal of the floating-gate field effect transistor from the injection voltage source;
  connecting the drain terminal of the floating-gate field effect transistor to a second supply voltage; and
  using the floating-gate field effect transistor as a reference current source.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A integrated circuit device comprising:
  a first transistor having gate, drain and source terminals and having a floating gate to store a first programmable charge level; and
  a second transistor having a floating gate to store a second programmable charge level and having a gate terminal coupled to the gate terminal and the drain terminal of the first transistor.

2. The integrated circuit device of claim 1 further comprising a floating-gate charge programmer to program the first programmable charge level and the second programmable charge level to respective charge levels indicated by one or more externally provided signals.

3. The integrated circuit device of claim 1 wherein a first current flow between the source and drain terminals of the first transistor is controlled, at least in part, by the first programmable charge level and wherein the first current flow is mirrored by a second current flow between a source terminal and the drain terminal of the second transistor.

4. The integrated circuit device of claim 3 wherein the first current flow and the second current flow are substantially equal.

5. The integrated circuit device of claim 3 wherein the first current flow and the second current flow are substantially proportional to one another.

6. The integrated circuit device of claim 1 wherein a first current flow between the source and drain terminals of the first transistor is controlled, at least in part, by the first programmable charge level, and wherein a second current flow between a source terminal and the drain terminal of the second transistor is controlled, at least in part, by the magnitude of the first current flow and the second programmable charge level.

7. The integrated circuit device of claim 6 wherein the first current flow and the second current flow have a mathematical relationship established, at least in part, by the relative magnitudes of the first and second programmable charge levels.

8. A method of operation within an integrated circuit device, the method comprising:
programming a first charge level on a floating gate of a first transistor having commonly coupled drain and gate terminals to establish a source-to-drain current therein; and
programming a second charge level on a floating gate of a second transistor having a gate terminal coupled to the gate terminal of the first transistor to establish a source-to-drain current in the second transistor that has a predetermined relationship to the source-to-drain current in the first transistor.

9. The method of claim 8 wherein the source-to-drain currents in the first and second transistors are substantially identical.

10. The method of claim 8 wherein the predetermined relationship is a linear relationship.

11. The method of claim 8 wherein the predetermined relationship is a non-linear relationship.

12. An apparatus comprising:
a first floating-gate transistor having gate and drain terminals coupled to one another;
means for programming a first charge level on a floating gate of the first floating-gate transistor to establish a source-to-drain current in the first floating-gate transistor;
a second floating-gate transistor having a gate terminal coupled to the gate terminal of the first floating-gate transistor; and
means for programming a second charge level on a floating gate of the second floating-gate transistor to establish a source-to-drain current in the second floating-gate transistor that has a predetermined relationship to the source-to-drain current in the first transistor.

* * * * *